United States Patent [19]

Redfern

[11] Patent Number: 4,721,922
[45] Date of Patent: Jan. 26, 1988

[54] ELECTRIC SIGNAL AMPLIFIERS

[75] Inventor: Martin W. Redfern, Maidstone, England

[73] Assignee: Gec Avionics Limited, England

[21] Appl. No.: 846,252

[22] Filed: Mar. 31, 1986

[30] Foreign Application Priority Data

Apr. 3, 1985 [GB] United Kingdom ............... 8508655

[51] Int. Cl.$^4$ ............................................ H03F 3/30
[52] U.S. Cl. .................................... 330/263; 315/403
[58] Field of Search ............... 330/262, 263, 267, 273; 315/403, 404, 407, 411

[56] References Cited

U.S. PATENT DOCUMENTS

| | | | |
|---|---|---|---|
| 3,801,858 | 4/1974 | Grangaard et al. | 315/403 X |
| 3,909,701 | 9/1975 | Waehner | 330/263 X |
| 4,390,846 | 6/1983 | Cragfors et al. | 330/124 R X |

Primary Examiner—James B. Mullins
Attorney, Agent, or Firm—Kirschstein, Kirschstein, Ottinger & Israel

[57] ABSTRACT

A linear high power amplifier suitable for low voltage operation comprising a push-pull output stage (Q1, Q2) arranged to control the voltage supplied to a load ($Z_L$) in dependence on an input signal ($V_{IN}$) applied to the amplifier. Means ($L_S$, S) is provided for separately supplying to said load ($z_L$) a current ($I_S$) which changes at a rate faster than the maximum rate of change of current ($I_L$) in the load ($Z_L$) required by the input signal ($V_{IN}$) thereby to produce a corresponding change in the current ($I_A$) required to be supplied by the output stage (Q1, Q2) to the load ($Z_L$) in order to maintain the voltage across the load ($Z_L$) at the value required by said input signal ($V_{IN}$). Switching means (Q3, Q4, C) operated in dependence on the value of the current ($I_A$) supplied to the load ($Z_L$) by the output stage (Q1, Q2) causes the sense in which said changing current ($I_S$) changes to reverse when said current ($I_A$) supplied by said output stage (Q1, Q2) exceeds a predetermined positive value ($I_{AP}$) or a predetermined negative value ($I_{AN}$) which predetermined values are less than the total current ($I_L$) required by the input signal ($V_{IN}$) to be supplied to the load ($Z_L$), thereby to restrict the current ($I_A$) supplied to the load ($Z_L$) by the output stage (Q1, Q2) to values between said predetermined values ($I_{AP}$, $I_{AN}$).

9 Claims, 3 Drawing Figures

ELECTRIC SIGNAL AMPLIFIERS

BACKGROUND OF THE INVENTION

1. Field of the Invention

This invention relates to electric signal amplifiers.

2. Description of Related Art

An amplifier required to impress an amplified version of an electric input signal on a load must have an output stage with adequate current and voltage capability. For loads requiring a high voltage/current product a simple amplifier has to dissipate high power in its output stage. In many applications this dissipation is intolerable and means to reduce the dissipation are sought. Beyond reducing the quiescent power in the output stage to near zero by so-called Class B operation, there are techniques that switch higher supply voltages to the output stage only when the output voltage is required to be high. Such techniques reduce dissipation by dropping as little voltage as possible across the output stage active devices. While satisfactory for medium and high voltages these techniques offer little benefit for low voltage, high current applications where load voltages are comparable with voltages dropped across the active devices. Furthermore, operating linear power active active devices at low voltages can often impair their gain and dynamic properties.

One known form of electric amplifier which can satisfactorily be used for low voltage, high current applications comprises: an output stage arranged to control the voltage supplied to the load in dependence on an input signal applied to the amplifier; means for separately supplying to said load a current which changes at a rate faster than the maximum rate of change of current in the load required by the input signal, thereby to produce a corresponding change in the current required to be supplied by the output stage to the load in order to maintain the voltage across the load at the value required by the input signal; and switching means operated in dependence on the value of the current supplied to the load by said output stage so as to control the sense in which the changing current changes, thereby to restrict the current supplied to the load by the output stage to values less than the total current required by the input signal.

Such an amplifier is shown in UK Patent Application No. GB 2070373-A. This amplifier uses a switching means comprising two switching circuits, one of which serves to restrict the current supplied by the output stage to values between two predetermined positive levels for positive input signals and the other of which restricts the current supplied by the output stage to values between two predetermined negative values for negative input signals.

SUMMARY OF THE INVENTION

It is an object of the present invention to provide an improved form of such an amplifier which utilizes a simpler switching means.

Accordingly the present invention provides an electric signal amplifier comprising an output stage arranged to control the voltage supplied to a load in dependence on an input signal applied to the amplifier; means for separately supplying to said load a current which changes at a rate faster than a maximum required rate of change of current in the load, thereby to produce a corresponding change in the current required to be supplied by the output stage to the load in order to maintain the voltage across the load at the value required by said input signal; and switching means operated in dependence on the value of the current supplied to the load by said output stage so as to control the sense in which said changing current changes, thereby to restrict the current supplied to the load by the output stage to values less than the total peak current required by the input signal; characterised in that said output stage is a push-pull stage and said switching means causes the sense in which the changing current changes to reverse only when said current supplied by said output stage exceeds a predetermined positive value or a predetermined negative value, which predetermined values are less than the total current required by the input signal to be supplied to the load, thereby to restrict the current supplied to the load by the output stage to values between said predetermined values.

Said means for separately supplying a current to said load suitably comprises an inductance connected in series with a voltage source across said load.

Said switching means suitably comprises two electronic switching elements respectively connected between one end of said load and points at potentials of opposite polarity with respect to the potential of the other end of said load.

BRIEF DESCRIPTION OF THE DRAWINGS

Two amplifiers in accordance with the invention will now be described, by way of example, with reference to the accompanying drawings in which.

DETAILED DESCRIPTION OF THE PREFERRED EMBODIMENTS

Figure 1:
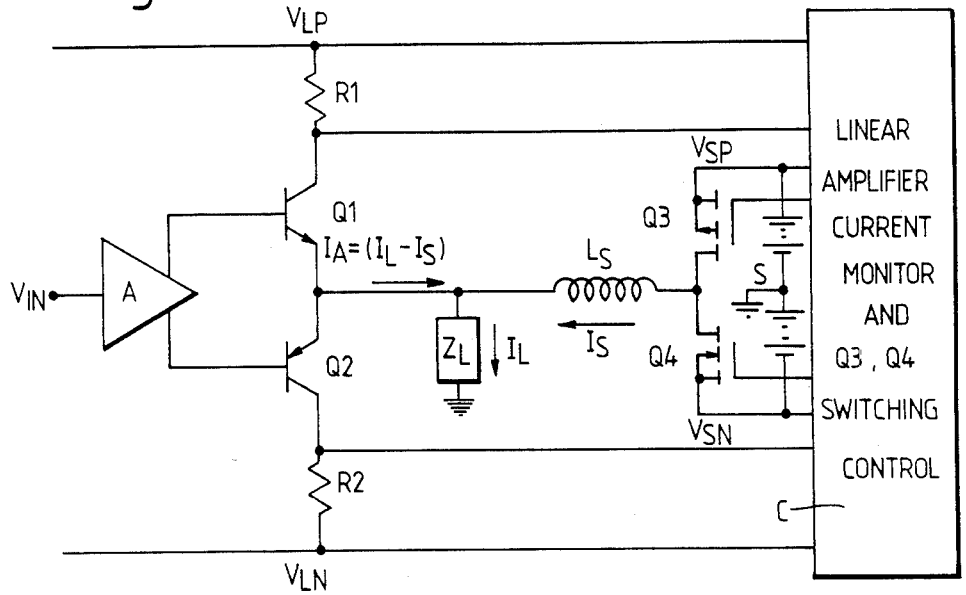
FIG. 1 is a circuit diagram of the first amplifier to be described.

Referring to FIG. 1, the first amplifier to be described comprises a push-pull output stage including an NPN transistor Q1 and a PNP transistor Q2 whose base potentials are controlled by outputs derived from the preceding stages of the amplifier represented by A, which operate as a linear amplifier, in dependence on an input signal $V_{IN}$. The collectors of transistors Q1 and Q2 are respectively connected to lines at positive and negative potentials $V_{LP}$ and $V_{LN}$ respectively with respect to ground via resistors R1 and R2, and the emitters of the transistors Q1 and Q2 are connected to one another and to one end of a load impedance $Z_L$ whose other end is grounded.

The ungrounded end of load impendance $Z_L$ is also connected to one end of an inductor $L_S$ whose other end is arranged for connection via a switching arrangement comprising two MOS field effect transistors Q3 and Q4 to either a positive potential $V_{SP}$ with respect to ground supplied by a voltage source S or a negative potential $V_{SN}$ with respect to ground supplied by the source S.

The gate potentials of the transistors Q3 and Q4 are controlled by a control circuit C in dependence on the currents in the transistors Q1 and Q2 as described in more detail below.

The operation of the amplifier is as follows:

The linear amplifier A controls the voltage supplied by output stage Q1, Q2 to the load $Z_L$ in response to its input voltage, $V_{IN}$, and establishes a load current, $I_L$.

Figure 3:
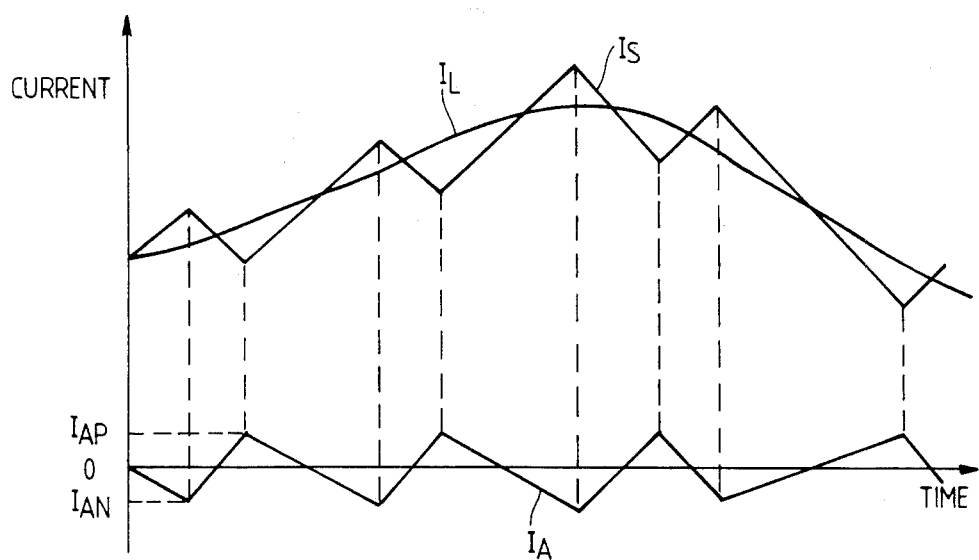
FIG. 3 is a graph illustrating the operation of the amplifier of FIG. 1.

Suppose that initially Q3 is 'on'; the resulting increasing current, $I_S$, through $L_S$ correspondingly reduces the current supplied to the load $Z_L$ by the output stage Q1, Q2. The current supplied by the output stage $I_A$ is $(I_L-I_S)$ and, providing $I_S$ can increase faster than $I_L$, $I_A$ will eventually become negative and reach a negative threshold $I_{AN}$. At this point the control circuit C switches Q3 'off' and Q4 'on'. The resulting change in polarity of voltage across $L_S$ causes the sense of the change in $I_S$ to change i.e. causes $I_S$ to decrease at a predictable rate. After a time, $I_A$ becomes positive and eventually reaches a positive threshold $I_{AP}$. This causes the control circuit C to turn Q4 'off' and Q3 'on' once again and the cycle of events described above recommences. Hence, as illustrated in FIG. 3, $I_A$ ramps up and down between the limits $I_{AP}$ and $I_{AN}$, irrespective of the load current $I_L$. If $I_{AP} = -I_{AN}$ the average value of $I_S$ equals $I_L$ and the average modulus of $I_A$ is $\frac{1}{2} I_{AP}$. Thus the bulk of the load current can be handled by the power efficient switching circuit Q3, Q4, $L_S$, leaving only a small ripple current to be handled by the output stage Q1, Q2 with consequent low dissipation.

The choice of $L_S$, $V_{SP}$ and $V_{SN}$ is limited by the rate of change of $I_L$ which $I_S$ must exceed. The faster the rate of change of $I_S$ required, then the higher will be the resulting switching frequency and switching losses for a given $I_{AP}$ and $I_{AN}$. Alternatively, for a given maximum switching frequency the higher the values of $I_{AP}$ and $I_{AN}$ need to be and hence the higher the dissipation in Q1 and Q2. In practice, a suitable compromise will result in a minimum overall dissipation. Clearly the faster Q3 and Q4 can switch the lower the switching and linear amplifier losses will be. With currently available fast switching power MOSFETs the usefulness of this technique extends to frequencies up to about 100 kHz in power bandwidth amplifier applications.

The load impedance $Z_L$ may be any mix of resistive and reactive components, but the improvement in efficiency by adding the switching circuit will depend on how well $I_S$ can follow demanded changes in $I_L$. If $Z_L$ is dominantly capacitive with fast changes of voltage being applied to it then $I_{AP}$ and $I_{AN}$ must be relatively high for a given maximum switching frequency for Q3 and Q4 and the resultant pulses in $I_A$ may not be significantly reduced by $I_S$. Generally amplifiers with loads which are dominantly resistive or inductive will benefit from the technique.

One particular application of an amplifier in accordance with the invention is for driving an inductive load such as a cathode ray tube (CRT) deflection coil.

Figure 2:
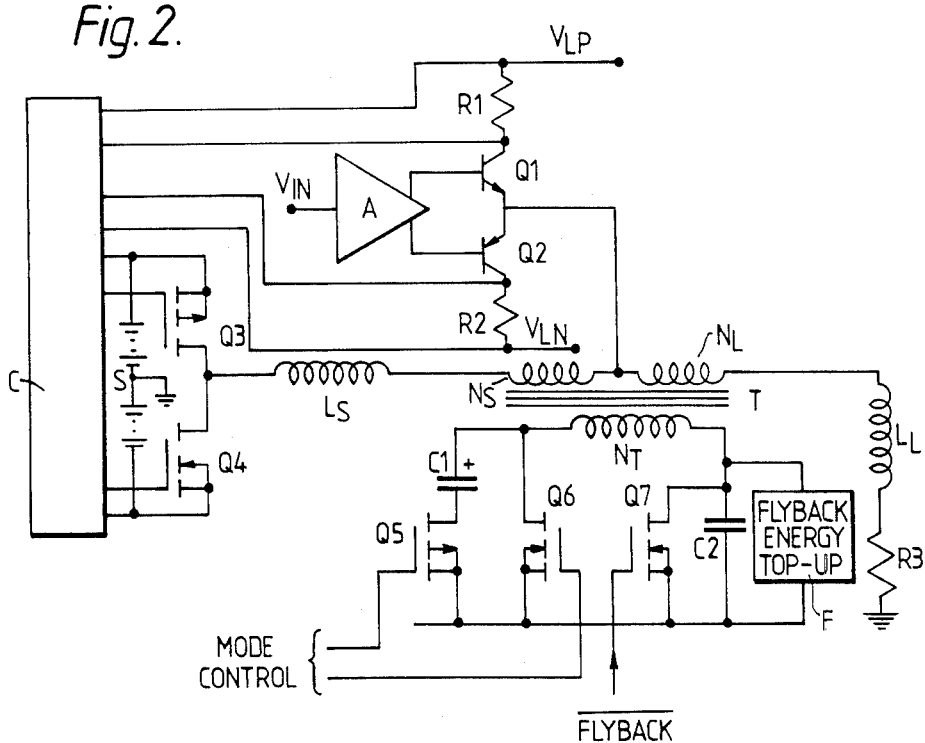
FIG. 2 is a circuit diagram of the second amplifier to be described.

One such arrangement is shown in FIG. 2, an inductance $L_L$ together with a series resistor R3 constituting the load impedance of the amplifier and the amplifier comprising output stage transistors Q1 and Q2, stages A, switching transistors Q3 and Q4, control circuit C and inductance $L_S$, as in the arrangement of FIG. 1.

In order to avoid the necessity of designing the amplifier to cope with very rapid changes in current in inductance $L_L$ such as may be required during raster fly-back where $L_L$ is a CRT deflection coil, such changes may be superimposed on the changes effected in response to changes in the amplifier input signal $V_{IN}$ via a transformer T.

The transformer T includes two windings $N_S$ and $N_L$ connected in series between the inductance $L_S$ and $L_L$ and a third winding $N_T$ having a turns ratio with winding $N_L$ such as to cause the required high voltage across inductance $L_L$.

The circuit for generating the required high voltages is connected across winding $N_T$, FIG. 2 showing, by way of example, a circuit comprising field effect transistors Q5, Q6 and Q7 capacitors C1 and C2 and a fly-back energy top-up circuit F for generating a unidirectional raster flyback pulse in response to a command signal $\overline{\text{FLYBACK}}$. The circuit also includes means for short circuiting winding $N_T$ in response to a mode control signal for modes of operation not requiring fast current changes in load inductance $L_L$.

The winding $N_S$ is required because throughout and after fast changes in the current in inductance $L_L$ imposed via transformer T the circuit $L_S$, Q3, Q4 must still supply the bulk of the load current in $L_L$. To this end complementary windings $N_S$ and $N_L$ are provided on transformer T to provide complementary voltages to $L_S$ and $L_L$. The turns ratio of the windings $N_S$ and $N_L$ is equal to the ratio of the values of inductances $L_S$ and $L_L$ during fly-back to provide similar rates of change of currents in $L_S$ and $L_L$.

The arrangement of FIG. 2 is suitably operated with the input signal $V_{IN}$ comprising a sawtooth component controlling the X or Y scan of a spot on the CRT screen and a dc component which may be varied to shift the location of the resulting scan on the CRT screen whilst rapid raster flyback is obtained as described above.

In a modification of the arrangement of FIG. 2, a bidirectional pulse transformer unit is provided to allow fast current changes in $L_S$ of either sense. However, such an arrangement is more complex in order to control the transformer flux integration and prevent transformer core saturation.

What is claimed is:

1. An electric signal amplifier comprising: an output stage arranged to control the voltage supplied to a load in dependence on an input signal applied to the amplifier; means for separately supplying to said load a current which changes at a rate faster than a maximum required rate of change of current in the load thereby to produce a corresponding change in the current required to be supplied by the output stage to the load in order to maintain the voltage across the load at the value required by said input signal; and switching means included in said supplying means, said switching means being operated in dependence on the value of the current supplied to the load by said output stage so as to control the sense in which said changing current changes, thereby to restrict the current supplied to the load by the output stage to values less than the total peak current required by the input signal; and including the improvement that said output stage is a push-pull stage and said switching means causes the sense in which the changing current changes tor reverse only when said current supplied by said output stage exceeds a single predetermined positive value or a single predetermined negative value, which predetermined values are less than the total peak current required by the input signal to be supplied to the load, thereby to cause the current supplied to the load by the output stage to oscillate between said predetermined values.

2. An amplifier according to claim 1 wherein said means for supplying a current to said load comprises an inductance connected in series with a voltage source across said load.

3. An amplifier according to claim 1 wherein said switching means comprises two electronic switching elements respectively connected between one end of said load and points at potentials of opposite polarity with respect to the potential of the other end of said load, and control means for opening one of said elements and closing the other each time said current supplied by said output stage exceeds either one of said predetermined values thereby to cause the sense in which the changing current changes to reverse.

4. An amplifier according to claim 3 wherein said switching elements are field effect transistors.

5. An amplifier according to claim 1 wherein said predetermined positive and negative values are of substantially equal magnitude.

6. An amplifier according to claim 1 including a transformer having a first winding connected in series with said load, and voltage generating circuit means connected across a second winding of said transformer to apply rapid changes in voltage across said second winding and hence said load whereby rapid changes of the current in said load may be superimposed on the changes effected in response to said input signal.

7. An amplifier according to claim 6 wherein said transformer has two said first windings connected in series between said load and said means for separately supplying a current to said load, and the output of said push-pull stage is applied to the junction between said two windings.

8. An amplifier according to claim 1 wherein said load is dominantly inductive.

9. An amplifier according to claim 8 wherein said load comprises a cathode ray tube deflection coil.

* * * * *